United States Patent [19]

Tajima et al.

[11] Patent Number: 4,949,155
[45] Date of Patent: Aug. 14, 1990

[54] TAPE CARRIER FOR SEMICONDUCTOR CHIPS

[75] Inventors: Naoyuki Tajima, Nara; Takaaki Tsuda, Tenri; Yasunori Chikawa, Nara, all of Japan

[73] Assignee: Sharp Kabushiki Kaisha, Osaka, Japan

[21] Appl. No.: 219,218

[22] Filed: Jul. 14, 1988

[30] Foreign Application Priority Data

Jul. 14, 1987 [JP] Japan .................... 62-107993[U]

[51] Int. Cl.⁵ .................................... H01L 23/48
[52] U.S. Cl. .................................... 357/68; 357/70
[58] Field of Search .................... 357/68, 70; 361/212, 361/220

[56] References Cited

U.S. PATENT DOCUMENTS

| | | | |
|---|---|---|---|
| 3,689,991 | 9/1972 | Aird | 357/80 |
| 4,575,747 | 3/1986 | Fritz | 357/70 |
| 4,689,875 | 9/1987 | Solstad | 357/70 |
| 4,721,993 | 1/1988 | Walter | 357/68 |
| 4,736,236 | 4/1988 | Butt | 357/68 |
| 4,792,532 | 12/1988 | Ohtani et al. | 357/70 |
| 4,822,989 | 4/1989 | Miyamoto et al. | 357/80 |

FOREIGN PATENT DOCUMENTS

| | | | |
|---|---|---|---|
| 60-198850 | 10/1985 | Japan | 357/70 |
| 61-17737 | 2/1986 | Japan . | |
| 2025129 | 1/1980 | United Kingdom | 357/68 |

*Primary Examiner*—Andrew J. James
*Assistant Examiner*—Courtney A. Bowers

[57] ABSTRACT

A tape carrier for semiconductor chips including an insulating tape; a plurality of first conductor patterns longitudinally formed on the tape and spaced from each other each of the first conductor patterns having first leads connected with substrate electrodes of a semiconductor chip and second lead connected with the other electrodes of the chip; a second conductor shaped like a stripe and disposed near each of the first conductor patterns on the tape; and a third conductor pattern formed on the tape and having conductors electrically connecting the first leads with the second conductor pattern.

10 Claims, 5 Drawing Sheets

TAPE CARRIER FOR SEMICONDUCTOR CHIPS

BACKGROUND OF THE INVENTION

1. Field of the Invention

The present invention relates to a tape carrier for semiconductor chips and, more particulary, to a tape (or film) carrier with a specific configuration that can prevent semiconductor chips from being damaged by electrostatic discharge (ESD) during the manufacturing process.

2. Description of the Prior Art

Tape automated bonding method (TAB) is a wireless bonding method for packaging semiconductor chips. In this bonding method, a metal foil is chemically etched to form finger-like leads which are then bonded to the electrodes of chips. The finger-like leads are formed on an insulating resinous film of a tape carrier (see U.S. Pat. No. 3,689,991). In the tape automated bonding method, holes for receiving chips and finger-like conductor leads are longitudinally arrayed on a long length of tape carrier. The conductor leads are formed by etching a film of a metal, such as a copper foil, which has been previously laminated on a tape. One end of each lead is bonded to an electrode bump on a semiconductor chip. After mounting semiconductor chips in this way, the tape carrier makes contact with, or is rubbed by, a reel for winding up the carrier or other device. Then, electrostatic charges are accumulated on the carrier, so that the potential on it is raised. If any conductor lead on the tape carrier makes contact with an object that is placed at a different potential, then the potential difference destroys oxide layers in a semiconductor chip.

In order to prevent such damage by electrostatic discharge, charged particles have been sprayed against conductor leads, or conductor leads have been brought into contact with a conductive material so as to remove electrostatic charges from the surface of the tape carrier. These two proposals are effective if all conductor leads are treated. However, where chips are successively held on a long length of tape moving at a high speed, it is difficult to completely remove electrostatic charges from all of the chips.

A carrier tape is known which has a conductor pattern to short-circuit all finger-like conductor leads connected with electrodes of tips in order to prevent such damage by electrostatic discharge (see Japanese published unexamined utility model application No. 17737/1986).

The above carrier tape, however, gives rise to difficulties in electrically testing semiconductor chips mounted on the carrier tape because all the finger-like leads are short-circuited.

SUMMARY OF THE INVENTION

The present invention relates to a tape carrier for semiconductor chips comprising an insulating tape, a plurality of first conductor patterns longitudinally formed on the tape and spaced from each other, a second conductor pattern shaped like a stripe and disposed near each of the first conductor patterns on the tape, and a third conductor pattern formed on the tape. The first conductor patterns each have first leads connected with substrate electrodes of a semiconductor chip and second leads connected with the other electrodes of the chip. The third conductor pattern has conductor leads which electrically connect the first leads with the second conductor pattern.

The substrate electrodes are defined as electrodes which are formed on a chip to be connected to the substrate of the chip and have the same potential that the substrate has.

In one feature of the invention, the first, second, and third conductor patterns are simultaneously formed by etching a metal foil laminate coated on the insulating tape. Preferably, the second conductor pattern comprises stripes which surround each of the first conductor patterns on every side or all but one side.

It is an object of the present invention that the semiconductors mounted on the carrier are prevented from damage by electrostatic discharge and can be electrically tested without being detached from the carrier.

DESCRIPTION OF THE PREFERRED EMBODIMENTS

Figure 1:
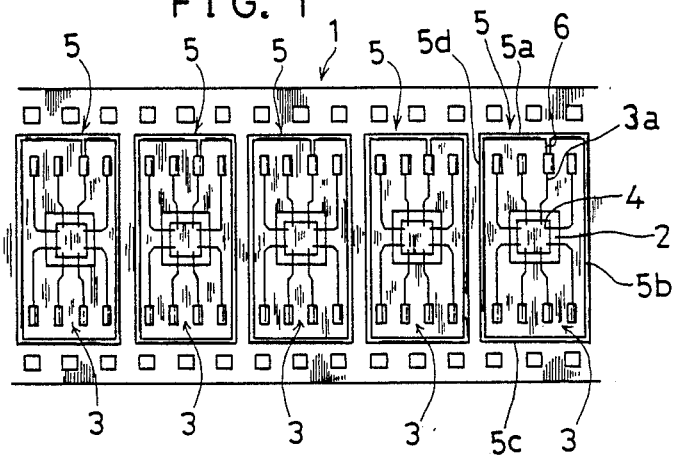
FIG. 1 is a top view of a tape carrier according to the invention.

Referring to FIG. 1 there is shown a preferred embodiment of the present invention. A tape carrier, generally indicated by numeral 1, has a length of 20 to 40 m. A plurality of holes 2 in which chips are inserted are longitudinally formed in the carrier. A metal film such as a copper foil is laminated on the carrier 1. The metal film is etched to form a first conductor pattern 3 around every hole 2, each conductor pattern 3 having eight conductor leads. A semiconductor chip 4 is placed in each hole 2. Then, electrode bumps (not shown) formed on the chip 4 are aligned with the front ends of the conductor leads protruding into the hole 2. Subsequently, the front ends are bonded to the bumps by eutectic soldering or other method. Simultaneously with the formation of the first conductor pattern 3, the metal film laminated on the carrier 1 is etched to form a second conductor pattern 5 surrounding the first conductor pattern 3 on every side.

More specifically, the second conductor pattern 5 comprises stripes 5a and 5c formed along the fringes of the tape carrier 1 and stripes 5b and 5d formed in regions delineating the boundaries between the adjacent first patterns 3.

The first conductor patterns 3 have a lead 3a connected to a substrate electrode of the semiconductor chip 4. The lead 3a is electrically connected to the second conductor pattern 5 by a conductor 6 of a third conductor pattern. The third conductor pattern 6 is also formed by etching the metal film laminated on the carrier 1.

The tape carrier 1 is made of a polyimide film, polyester film, or glass epoxy resin film, is 35 or 70 mm wide, 20 to 40 m long, and 50 to 125 μm thick.

Each pattern is formed by etching the copper foil of 18 to 35 μm thick laminated to the surface of the tape carrier according to a desired pattern and then is plated with tin, gold, or other material.

In the description made above, each of the first pattern consists of eight leads. The invention can also be applied to a film carrier having a first pattern consisting of 100 to 250 leads, for example.

Figure 2:
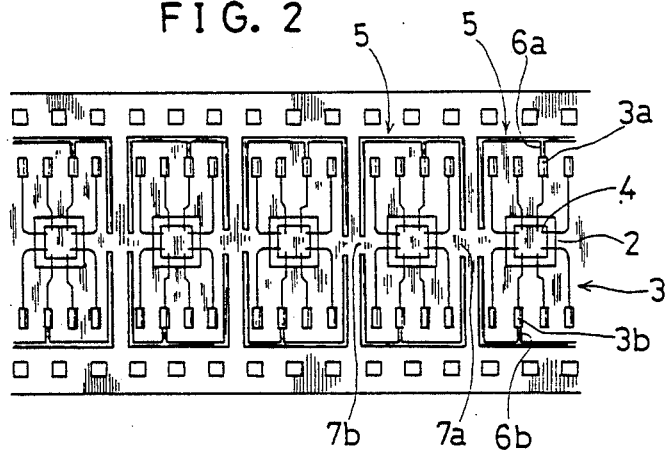
FIG. 2 is a top view of a modification of the carrier shown in FIG. 1.

Referring next to FIG. 2, there is shown a modification of the tape carrier shown in FIG. 1. A second conductor pattern 5 has electrically nonconducting portions 7a and 7b. Conductor leads 3a and 3b which are each connected with two substrate electrodes of a semiconductor chip 4 are electrically connected with the second pattern 5 by conductors 6a and 6b of a third conductor pattern.

Figure 3:
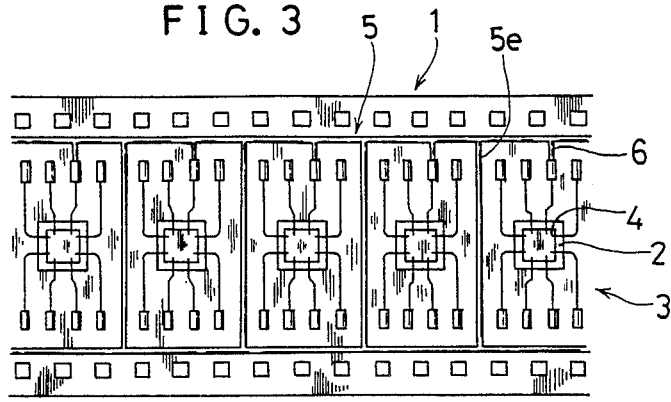
FIG. 3 is a top view of another tape carrier according to the invention.

Referring to FIG. 3, there is shown another tape carrier similar to the tape carrier shown in FIG. 1 except that the adjacent stripes 5b and 5d are formed into a single stripe 5e, the stripes 5a and 5c are formed into continuous lines, respectively, and the second conductor pattern is electrically connected with the adjacent patterns on both sides.

Figure 4:
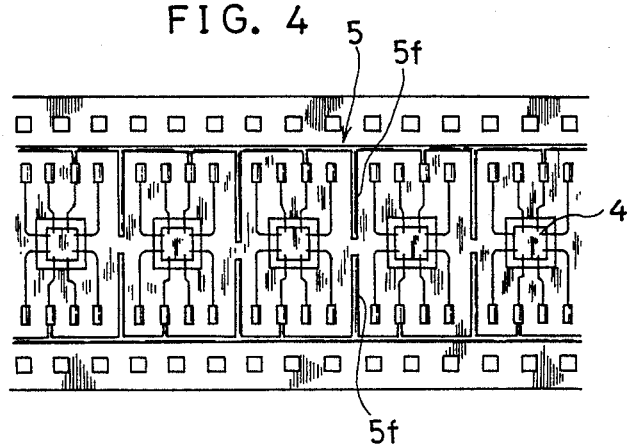
FIG. 4 is a top view of a further tape carrier according to the invention.

Referring to FIG. 4, there is shown a further tape carrier similar to the carrier shown in FIG. 2 except that the adjacent stripes are integrated into a single stripe 5f and the second conductor pattern 5 is electrically connected with the adjacent patterns on both sides.

Figure 5:
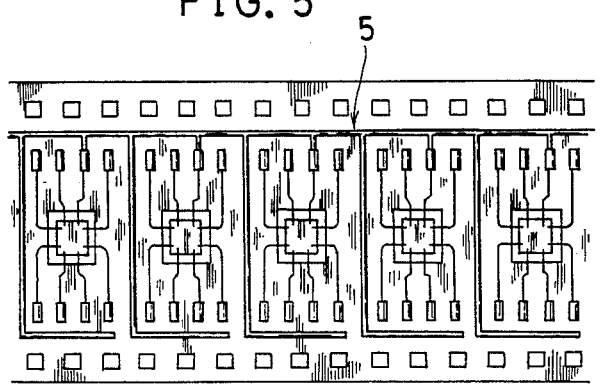
FIGS. 5–7 are top views of modifications of the carrier shown in FIG. 3.
Figure 6:
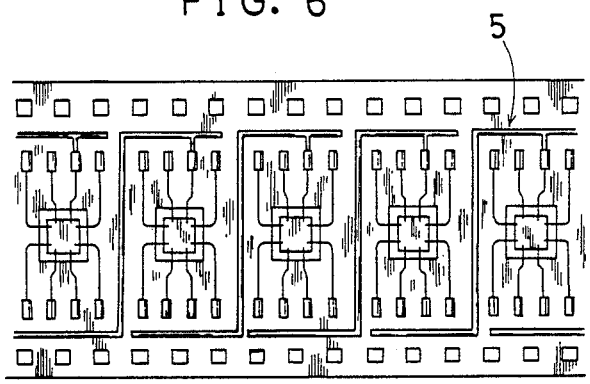
Figure 7:
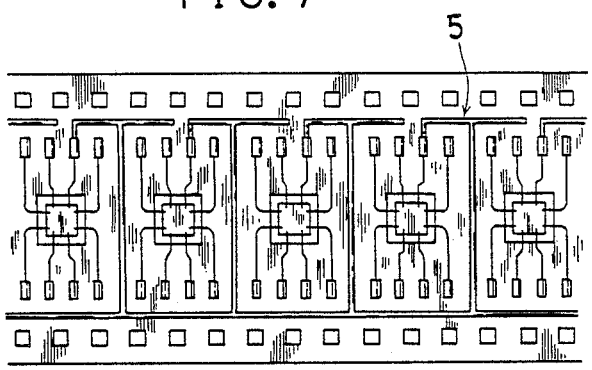

FIGS. 5-7 show tape carriers similar to the carrier shown in FIG. 3 except that the second conductor pattern 5 is made discontinuous at one or more portions.

Figure 8:
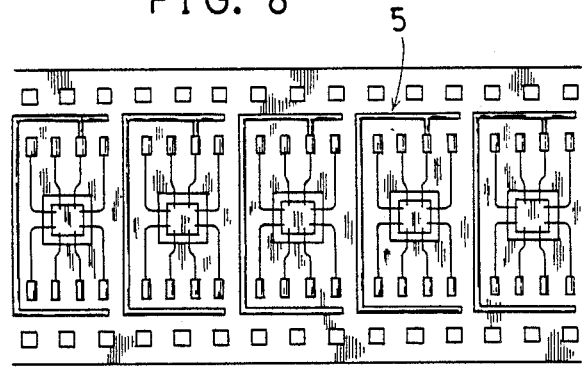
FIGS. 8–13 are top views of still other tape carriers according to the invention.
Figure 9:
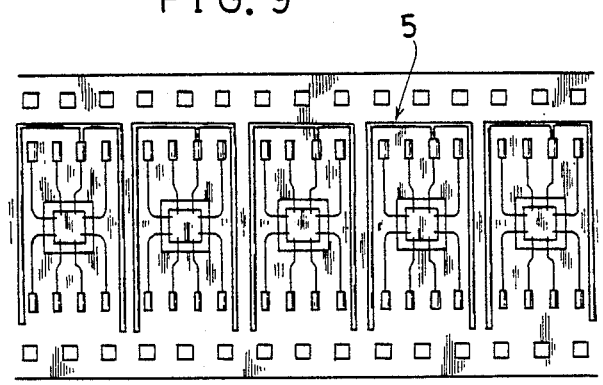

Referring to FIGS. 8 and 9, there are shown yet other tape carriers similar to the carrier shown in FIG. 1 except that the stripes 5b and 5c are respectively omitted.

Figure 10:
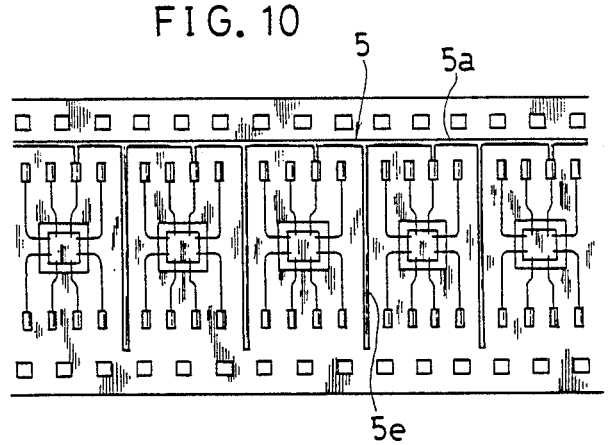

Referring to FIG. 10, there is shown still another tape carrier similar to the carrier shown in FIG. 9 except that the adjacent stripes 5b and 5d are formed into a stripe 5e, the stripes 5a are formed into a single continuous stripe, and the second conductor pattern 5 is electrically connected with the adjacent patterns on both sides.

Figure 11:
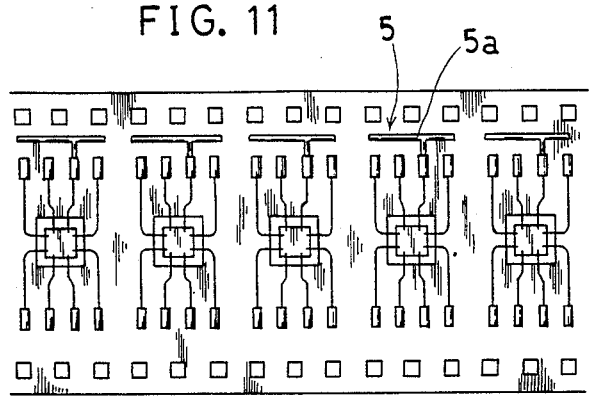

Referring to FIG. 11, there is shown a still further tape carrier similar to the carrier shown in FIG. 1 except that the stripes 5b, 5c and 5d are removed.

Figure 12:
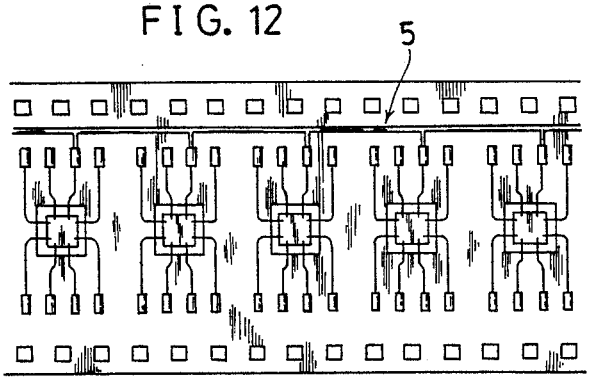

Referring to FIG. 12, there is shown a yet further tape carrier similar to the carrier shown in FIG. 11 except that the neighboring stripes 5a are formed into a single stripe.

Figure 13:
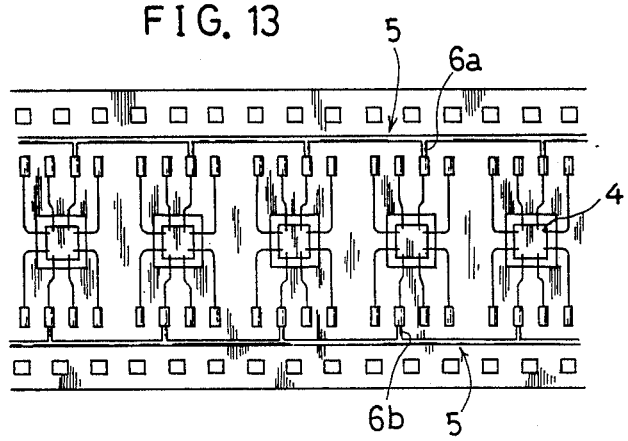

Referring to FIG. 13, there is shown still another tape carrier similar to the carrier shown in FIG. 4 except that the stripes 5f are removed from each boundary between the chips 4.

When semiconductor chips are mounted on the tape carrier having the conductors of the aforementioned patterns according to the invention, electrostatic charges are built up on the surface of the carrier by making contact or frictional contact with a reel or other device. However, a capacitance for electrostatic charges of the tape carrier is large, because it is constructed such that the second conductor pattern is connected with the substrate electrode through the third conductor pattern, which lowers the potential of the tape carrier. That is, when an electrostatic charge Q is accumulated on the tape carrier having a capacitance C, a potential V of the tape carrier becomes lower as the capacitance C is greater, because the potential V is defined as Q/C.

An advantage of the tape carrier of the present invention was confirmed by the following comparison test.

In the test, a carrier A is a tape carrier having the same conductor patterns as shown in FIG. 3, and a carrier B is a tape carrier having the same conductor pattern except the third conductor pattern, which is shown in U.S. Pat. No. 3,689,991. Each of the tape carriers is made of a polyimide film, 35 mm wide and 50 $\mu$m thick. Each of the carriers A and B, after being mounted with chips, was wound up by a real with a polyester film tape having the same width as the carrier and was then pulled out from the reel to be separated from the film tape.

The carrier was forceably charged with electrostatic charges by separating the carrier from the polyester film tape, and was rubbed with a metallic blush grounded to the earth. The damage by electrostatic discharge on all of the chips was examined.

Table 1 shows that the number of chips protected against damage by electrostatic discharge on the tape carrier A are larger than on the conventional tape carrier B.

TABLE 1

| Carrier | X: Numbers of chips | Y: Numbers of broken chips | Y/X (%) |
|---------|---------------------|----------------------------|---------|
| B | 74 | 10 | 13.5% |
| A | 77 | 3 | 3.9% |

In accordance with the present invention, the potential at the tape carrier can be lowered. Therefore, an unbalanced potential condition inside each chip can be moderated and chips can be protected against the damage by electrostatic discharge during the manufacturing process. Consequently, the manufacturing yield can be enhanced. Hence, the invention contributes toward making the reliable semiconductor device fabrication process more efficient.

What is claimed is:

1. A tape carrier for semiconductor chips, comprising:

an insulating tape;
   a plurality of first conductor patterns longitudinally formed on the insulating tape and spaced from each other, each of the first conductor patterns having a first lead connected with a substrate electrode of a semiconductor chip and second leads connected with the other electrodes of the chip;
   a second stripe shaped conductor pattern disposed near each of the first conductor patterns on the insulating tape; and
   a third conductor pattern formed on the insulating tape and having conductors electrically connecting the first lead with the second conductor pattern;
   said second conductor pattern being connected with the substrate electrode through the third conductor pattern, thereby lowering the electrostatic potential of the tape carrier, each of these second leads being separate from any other lead and conductor pattern, thereby enabling individual testing of semiconductor chips mounted on the tape carrier.

2. The tape carrier of claim 1, wherein the first, second, and third conductor patterns are etched on a metal foil laminated on the insulating tape.

3. The tape carrier of claim 1, wherein the second conductor pattern has stripes surrounding the first conductor pattern on every side.

4. The tape carrier of claim 3, wherein the second conductor pattern is electrically connected with adjacent second conductor patterns on both sides thereof.

5. The tape carrier of claim 3 or 4, wherein the second conductor pattern is discontinuous at one or more portions.

6. The tape carrier of claim 1, wherein the second conductor pattern has stripes surrounding the first conductor pattern on all but one side thereof.

7. The tape carrier of claim 6, wherein the second conductor pattern is electrically connected with adjacent second conductor patterns on both sides thereof.

8. The tape carrier of claim 1, wherein the second conductor pattern has a stripe formed along one edge of the insulating tape.

9. The tape carrier of claim 8, wherein the second conductor is electrically connected with adjacent second conductor patterns on both sides thereof.

10. The tape carrier of claim 1, wherein the second conductor pattern has stripes formed along both edges of the insulating tape.

* * * * *